(12) United States Patent
Oh et al.

(10) Patent No.: US 8,716,930 B2
(45) Date of Patent: May 6, 2014

(54) FLAT PANEL DISPLAY DEVICE AND METHOD THEREOF

(71) Applicant: Samsung Display Co., Ltd., Yongin (KR)

(72) Inventors: Tae-sik Oh, Suwon-si (KR); Sung-kee Kang, Seongnam-si (KR); Jung-woo Kim, Yongin-si (KR); Ho-nyeon Lee, Seongnam-si (KR); Young-tea Chun, Suwon-si (KR); Mi-jeong Song, Suwon-si (KR)

(73) Assignee: Samsung Display Co., Ltd. (KR)

( * ) Notice: Subject to any disclaimer, the term of this patent is extended or adjusted under 35 U.S.C. 154(b) by 0 days.

(21) Appl. No.: 13/706,493

(22) Filed: Dec. 6, 2012

(65) Prior Publication Data

US 2013/0093317 A1    Apr. 18, 2013

Related U.S. Application Data

(62) Division of application No. 11/610,681, filed on Dec. 14, 2006, now Pat. No. 8,350,467.

(30) Foreign Application Priority Data

Jan. 11, 2006    (KR) .................... 10-2006-0003119

(51) Int. Cl.
*H01L 51/52*    (2006.01)

(52) U.S. Cl.
USPC .......................... 313/509; 313/504; 313/506

(58) Field of Classification Search
USPC ............... 313/582–587, 498–512; 315/169.1, 315/169.4, 169.3; 345/37, 41, 60, 71; 428/690–691, 917; 438/26–29, 34, 82; 257/40, 72, 98–100, 642–643, 759; 427/66, 532–535, 539
See application file for complete search history.

(56) References Cited

U.S. PATENT DOCUMENTS

| 6,054,809 | A | 4/2000 | Haynes et al. |
| 6,879,099 | B2 * | 4/2005 | Kihara et al. ................. 313/504 |
| 7,157,153 | B2 * | 1/2007 | Yamada et al. ............... 428/688 |
| 7,422,503 | B2 * | 9/2008 | Fujitani et al. .................. 445/24 |
| 2002/0041157 | A1 * | 4/2002 | Heo ............................. 313/586 |
| 2002/0180371 | A1 | 12/2002 | Yamazaki et al. |
| 2004/0201351 | A1 * | 10/2004 | Woo et al. ..................... 313/582 |

(Continued)

FOREIGN PATENT DOCUMENTS

| JP | 1999121165 A | 4/1999 |
| JP | 2002025765 A | 1/2002 |
| JP | 2004095482 A | 3/2004 |
| JP | 2005011573 A | 1/2005 |

*Primary Examiner* — Ahn Mai
*Assistant Examiner* — Fatima Farokhrooz
(74) *Attorney, Agent, or Firm* — Cantor Colburn LLP

(57) ABSTRACT

A flat panel display device including a display area where an image is displayed and a non-display area located at an outside of the display area includes bank portions arranged in a pattern in the display area and partitioning a plurality of openings, emission elements located in the openings, dummy bank portions formed in the non-display area and integrated therewith, and a sealing passivation layer having a multi-layered structure of organic films and inorganic films alternately arranged, one organic film being located at an interface directly contacting the emission element and one inorganic film located firstly on an outermost portion of the dummy bank portions when the sealing passivation layer extends from the display area to the non-display area.

11 Claims, 10 Drawing Sheets

(56) References Cited

U.S. PATENT DOCUMENTS

| | | | |
|---|---|---|---|
| 2005/0046346 A1* | 3/2005 | Tsuchiya et al. | 313/509 |
| 2005/0242728 A1* | 11/2005 | Song et al. | 313/583 |
| 2006/0006424 A1 | 1/2006 | Yamazaki et al. | |
| 2006/0113896 A1 | 6/2006 | Cho | |
| 2007/0236139 A1 | 10/2007 | Kobayashi et al. | |

* cited by examiner

# FLAT PANEL DISPLAY DEVICE AND METHOD THEREOF

This application is a divisional application of U.S. application Ser. No. 11/610,681 filed Dec. 14, 2006, which claims priority to Korean Patent Application No. 10-2006-0003119, filed on Jan. 11, 2006 and all the benefits accruing therefrom under 35 U.S.C. §119, and the contents of which in its entirety are herein incorporated by reference.

BACKGROUND OF THE INVENTION

1. Field of the Invention

The present invention relates to a flat panel display device and method thereof, and more particularly, to a flat panel display device preventing oxidation/corrosion due to harmful material such as oxygen/moisture and a method of fabricating the flat panel display device.

2. Description of the Related Art

FIG. 1 is a cross-sectional view of a conventional flat panel display device and in particular, an organic light-emitting display device disclosed in Japanese Patent Publication No. 1999-121165. Referring to FIG. 1, on a substrate 11, a first electrode layer 21 constituting an anode electrode injecting holes, an organic film 25 in which light is emitted by the recombination of holes and electrons, and a second electrode layer 29 constituting a cathode electrode injecting electrons are formed successively. Light is produced in the organic film 25 by the recombination of the holes injected from the first electrode layer 21 and the electrons injected from the second electrode layer 29. The second electrode layer 29 injecting electrons is highly active and chemically unstable, and therefore reacts easily with moisture and oxygen of the outside air leading to oxidization and corrosion. With the permeation of moisture or oxygen into the organic film 25, the emission characteristics of the organic film 25 degrade due to a change of crystalline structure and in an extreme case, dark spots are formed, adversely affecting a display function. Thus, in the conventional art, a double surrounding wall including inner wall 31 and outer wall 35 which surround emission layer 25 are formed to prevent the permeation of harmful material such as oxygen/moisture from the outside into the emission layer 25. In the conventional art, an additional process of forming the surrounding wall is required so that manufacturing productivity is lowered, thereby causing a problem that the reliability of the product is deteriorated such as due to a bad sealing property of the wall.

BRIEF SUMMARY OF THE INVENTION

The present invention provides a flat panel display device preventing the degradation of performance over a period of time by blocking the permeation of harmful material such as oxygen or moisture.

The present invention also provides a flat panel display device minimizing an additional process or an additional manufacturing cost.

The present invention also provides a method of fabricating the flat panel display device.

According to exemplary embodiments of the present invention, there is provided a flat panel display device including a display area where a desired image is displayed and a non-display area located at an outside of the display area. The flat panel display device includes bank portions arranged in a pattern in the display area and partitioning a plurality of openings, emission elements located in the openings, dummy bank portions formed in the non-display area and integrated with the bank portions, and a sealing passivation layer having a multi-layered structure of organic film and inorganic film alternately arranged, one organic film located at an interface directly contacting the emission elements and one inorganic film arranged firstly on the dummy bank portions when the sealing passivation layer extends from the display area to the non-display area.

According to other exemplary embodiments of the present invention, there is provided a flat panel display device including a display area where a desired image is displayed and a non-display area located at an outside of the display area. The flat panel display device includes bank portions arranged in a pattern in the display area and partitioning a plurality of openings, emission elements located in the openings, dummy bank portions formed in the non-display area and integrated with the bank portions in the display area, an encapsulation material burying the dummy bank portions, and a sealing passivation layer covering the emission elements and having a multi-layered structure of at least one organic film and at least one inorganic film alternately arranged.

According to other exemplary embodiments of the present invention, there is provided a flat panel display device including a display area where a desired image is displayed and a non-display area located at an outside of the display area. The flat panel display device includes bank portions arranged in a pattern in the display area and partitioning a plurality of openings, emission elements located in the openings, dummy bank portions formed in the non-display area and integrated with the bank portions, blocking members disposed between the dummy bank portions preventing permeation of harmful material to the emission elements, and a sealing passivation layer covering the emission elements and having a multi-layered structure of at least one organic film and at least one inorganic film alternately arranged.

According to other exemplary embodiments of the present invention, there is provided a flat panel display device including a display area where a desired image is displayed and a non-display area located at an outside of the display area. The flat panel display device includes bank portions arranged in a pattern in the display area and partitioning a plurality of openings, emission elements located in the openings, dummy bank portions formed in the non-display area and integrated with the bank portions in the display area, and a sealing passivation layer isolating the emission elements from outside air and having a multi-layered structure of at least one organic film and at least one inorganic film alternately arranged and extending from the display area to the non-display area.

According to other exemplary embodiments of the present invention, there is provided a method of fabricating a flat panel device having protection from harmful material, the flat panel display device including a display area where an image is displayed and a non-display area located at an outside of the display area, the method including providing a substrate, forming bank portions within the display area on the first substrate in a pattern having partitioned openings to receive emission elements within the openings, and forming dummy bank portions within the non-display area on the first substrate substantially simultaneously with forming the bank portions in the display area, the dummy bank portions forming at least part of a blocking wall preventing entrance of harmful material into the display area from a side of the flat panel device.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Figure 1:
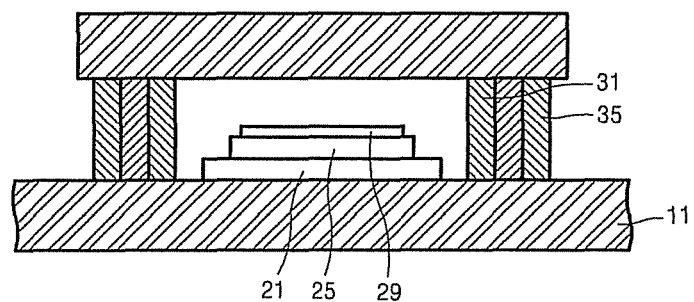
FIG. 1 is a cross sectional view of a conventional flat panel display device.

The invention will now be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be present there between. In contrast, when an element is referred to as being "directly on" another element, there are no intervening elements present. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments of the present invention are described herein with reference to cross section illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present invention.

Hereinafter, the present invention will be described in detail with reference to the accompanying drawings.

Figure 2A:
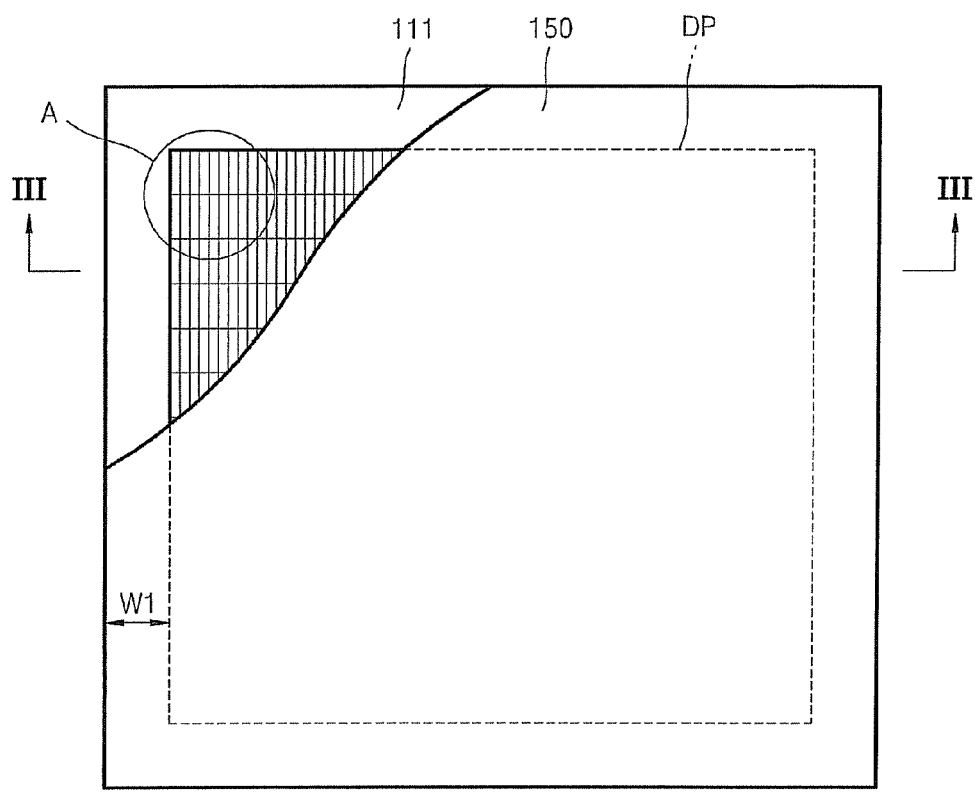
FIG. 2A is a plan view of an exemplary flat panel display device according to an exemplary embodiment of the present invention.
Figure 2B:
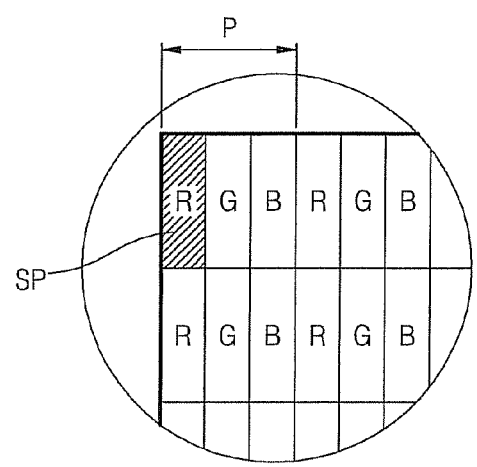
FIG. 2B is an enlarged view of portion A of FIG. 2A.

FIG. 2A is a plan view of an exemplary flat panel display device according to an exemplary embodiment of the present invention, and FIG. 2B is an enlarged view of portion A of FIG. 2A. Referring to FIG. 2A, the flat panel display device includes a display area DP where a desired image is displayed, and a non-display area bordering the display area DP with a desired width W1. As shown in FIG. 2B, in the display area DP, a plurality of subpixels SP are arranged in an array and each subpixel SP is classified as a red subpixel (R), a green subpixel (G) or a blue subpixel (B) according to emission color. While a particular pattern of subpixels SP is shown, it should be understood that alternate patterns would be within the scope of these embodiments. For example, a first row of subpixels SP may have a different pattern than a second row of subpixels SP. A unit pixel consists of a red subpixel, a green subpixel, and a blue subpixel and each subpixel SP includes an emission element (referred to as an organic electroluminescent element or an "organic EL element") having a corresponding emission color. The non-display area is located along the outside of the display area DP to provide a shielding function to the display area DP.

Figure 3:
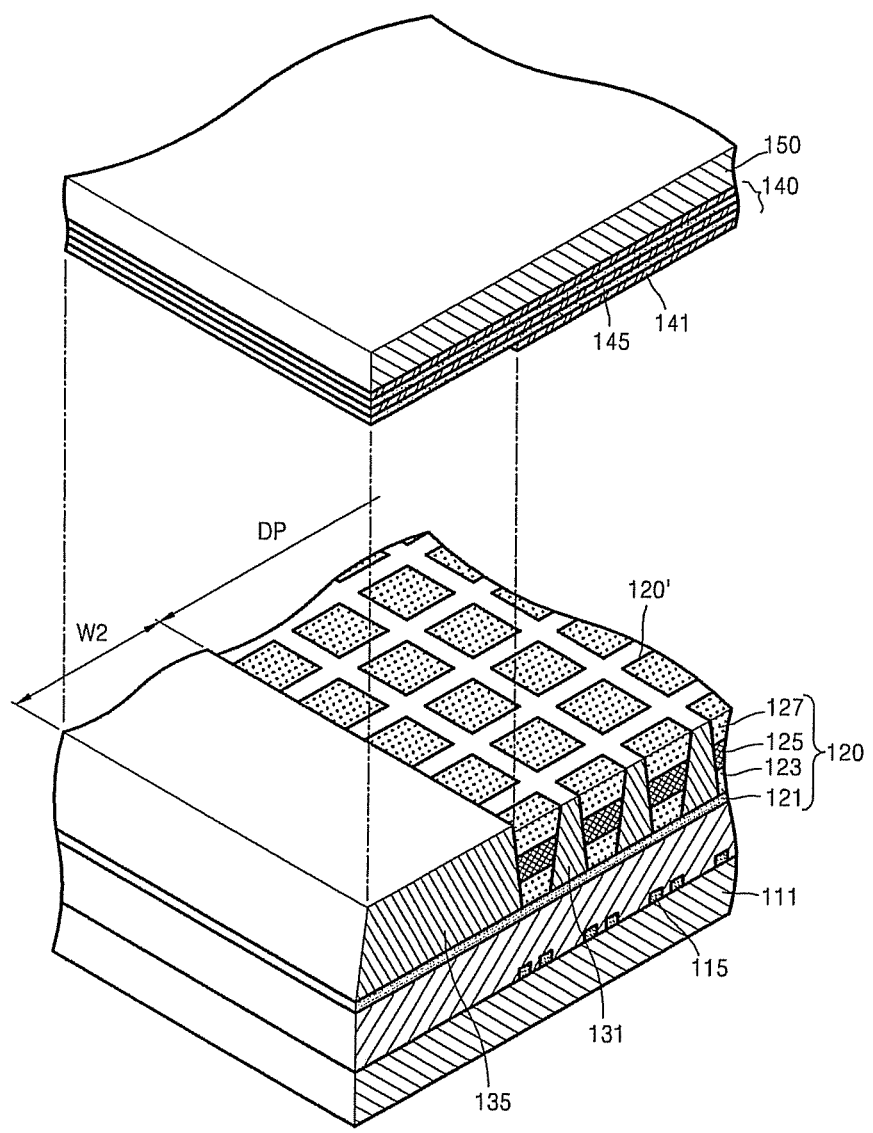
FIG. 3 is a perspective view of the exemplary flat panel display device of FIGS. 2A and 2B, according to an exemplary embodiment of the present invention.
Figure 4:
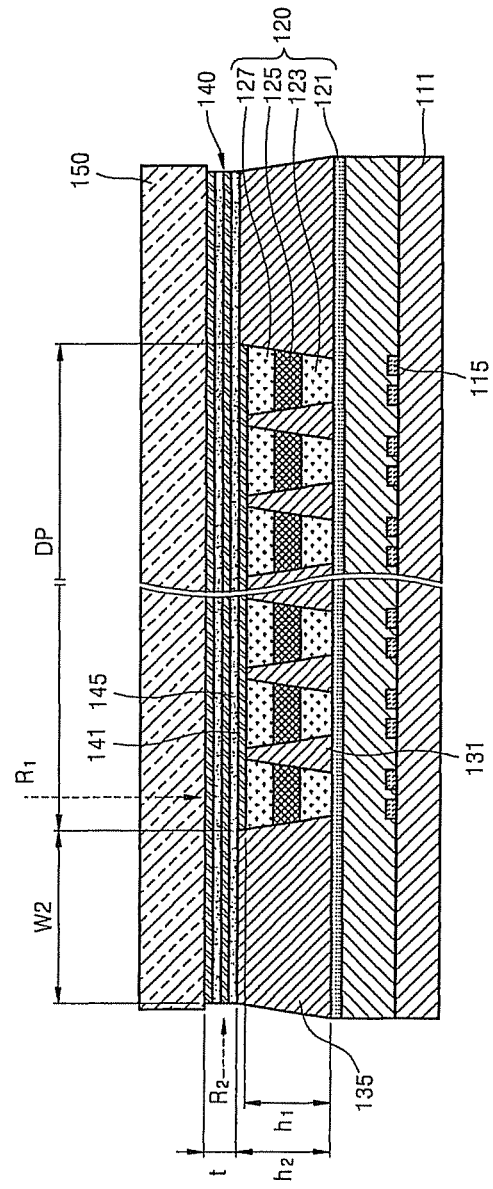
FIG. 4 is a cross-sectional view of the exemplary flat panel display device of FIG. 2A taken along line III-III of FIG. 2A, according to an exemplary embodiment of the present invention.

FIG. 3 is a perspective view of the exemplary flat panel display device of FIGS. 2A and 2B, according to an exemplary embodiment of the present invention, and FIG. 4 is a cross-sectional view of the exemplary flat panel display device of FIG. 2 taken along line III-III indicated in FIG. 2A, according to an exemplary embodiment of the present invention. Referring to FIGS. 3 and 4, the display area DP is provided with bank portions 131 partitioning a plurality of organic EL elements 120. Each organic EL element 120 forms an electrical and optical independent light-emitting area by the bank portions 131.

Each organic EL element 120 includes a first electrode 121 and a second electrode 127, and an organic film inserted between the first and second electrodes 121 and 127. As shown in FIGS. 3 and 4, the organic film includes an emission layer 123 and a hole injecting layer 125. If a low molecular organic film is used as the organic film, it may have a stacked structure of a hole injection layer ("HIL"), a hole transport layer ("HTL"), an emission layer ("EML"), an electron injection layer ("EIL"), and an electron transport layer ("ETL"), or a combination thereof. Also, if a high molecular organic film is used as the organic film, it may have a stacked structure of a hole transport layer ("HTL") and an emission layer ("EML"). The organic film is not limited to the above-described structures, and may instead be, for example, a single emission layer or a two-layered structure of a hole transport layer and an emission layer or a two-layered structure of an emission layer and an electron transport layer.

The emission layer 123 for each organic EL element 120 is classified as a red emission layer, a green emission layer, or a blue emission layer according to emission color and the red, green, and blue emission layers are located side by side constructing one pixel.

The first electrode 121 and the second electrode 127 function as a cathode and an anode respectively and the first electrode 121 may be formed commonly for a plurality of the organic EL elements 120 and the second electrode 127 may be formed independently for each organic EL element 120. The flat panel display device according to the current embodiment of the present invention is a top emission type device and it is desirable for light extraction effectiveness to form the second electrode 127 of a transparent electrode material. The transparent electrode material used to form the second electrode 127 is, for example, indium tin oxide ("ITO"), indium zinc oxide ("IZO"), etc. In the meantime, it is desirable to form the first electrode 121 as a metal film having good light reflection properties to reflect light incident to the first electrode 121 upwards and for example, a conducting material such as Al or Ag may be used to form the first electrode 121.

The flat panel display device as shown is an active matrix display device including thin film transistors ("TFTs"), and TFTs such as switching TFTs, driving TFTs, etc. and capacitors may be included in a TFT layer 115 deposited under the organic light-emitting diode 120. The number or the type of the TFTs is not limited to the above described TFTs and thus, it is possible to make various modifications. For example, a switching TFT detects an on/off condition of the corresponding organic EL element 120 and a driving TFT controls the current supplied to the organic EL element 120 according to a switching TFT signal. The second electrode 127 is connected electrically to the drain electrode of the driving TFT and a controlled driving current is supplied to the corresponding organic EL element 120 through the second electrode 127.

In the non-display area, dummy bank portions 135 integrated with the bank portions 131 in display area DP are provided. The dummy bank portions 135 of the non-display area are formed together with the bank portions 131 of the display area DP. The bank portions 131 partition a plurality of openings 120' in a matrix pattern and the dummy bank portions 135 having a width W2 are formed at the outside of the display area DP. The bank portions 131 and the dummy bank portions 135 integrated thereto are for example, formed using the following process. After coating a raw material used for forming the bank portions 131 on a first substrate 111, on which a TFT layer 115 and a first electrode 121 are already formed, e.g., polymer resin material such as PVA over the whole surface of the substrate 111 including the display area DP and the non-display area, a uniform opening pattern is formed over the display area DP defining the emission area of the organic EL elements 120. In this way, the bank portions 131 of the display area DP and the dummy bank portions 135 of the non-display area are concurrently obtained. That is, the bank portions 131 and the dummy bank portions 135 are formed within a same processing step of fabricating the flat panel display device. In the openings 120', the emission layer 123, the organic film including the hole injection layer 125, and the second electrode 127 are formed successively thereby obtaining the organic EL elements 120.

The dummy bank portions 135 perform a shielding function preventing the permeation of harmful material, thereby preventing portions of the organic EL element 120, such as the emission layer 123 or the first and second electrodes 121 and 127, from being oxidised and corroded. As compared with conventional methods requiring an additional process and cost for manufacturing a partitioning wall to prevent the permeation of harmful material, the exemplary embodiments of the present invention use a conventional process for forming the bank portions 131 in the display area DP for the dummy bank portion 135 functioning as a shielding barrier so that additional processes or costs are minimized. The dummy bank portions 135 are designed to have a width W2 to prevent the permeation of harmful material. The width W2 of the dummy bank portions 135 may be designed to have twice the pitch (2×P) or more (W2>2×P) in a pixel array such that a unit pixel consisting of red, green, and blue subpixels is repeated by one pitch distance P (Refer to FIG. 2).

It is desirable that when the upper portion of the flat panel display device is covered by a second substrate 150, the dummy bank portions 135 are higher than the bank portions 131 to sufficiently blocking out the outside air. That is, it is desirable to satisfy a relationship of h2>h1 wherein the height of the bank portions 131 is h1 and the height of the dummy bank portion 135 is h2.

In the present invention, in order to prevent the permeation of moisture and oxygen into the organic EL element 120, a sealing passivation layer 140 is formed on the organic EL elements 120, having a thickness t and a multi-layer structure of an organic film 141 and an inorganic film 145. The sealing passivation layer 140 preferably has at least two films 141 and 145 to block the permeation of the harmful material. In this case, the sealing passivation layer 140 has at least one of the organic film 141 and at least one of the inorganic film 145, and further has alternating layers of the organic film 141 and the inorganic film 145.

The organic film 141 may be formed of a high molecular organic film, for example, polyacrylate, polyurea, polyester, polyethylene, polypropylene, methacrylic, acrylic etc. and derivatives thereof or a small molecular organic film but the present invention is not limited thereto. Also, the inorganic film 145 deposited on the organic film 141 may be formed of silicon oxide, silicon carbide or silicon nitride, for example $SiO_2$, SiC, SiN, SiON or $In_2O_3$, $TiO_2$, $Al_2O_3$.

Due to the multi-layered sealing passivation layer 140, the permeation of harmful material through a main surface, i.e., a path R1 indicated in FIG. 4 is effectively prevented. However, in spite of the multi-layered sealing passivation layer 140, harmful material permeating along a path R2, i.e., through the side portion of the sealing passivation layer 140 is not prevented effectively. In order to prevent harmful material permeating along a path R2, in exemplary embodiments of the present invention, the sealing passivation layer 140 has a multi-layered structure where a layer of the sealing passivation layer 140 directly contacting the organic EL elements 120, i.e., an interface film directly contacting the organic EL elements 120, should be an organic film 141 having a planarizing effect. Further, the order of depositing is determined such that the film arranged firstly on the dummy bank portion 135 is to be an inorganic film 145 when the multi-layered sealing passivation layer 140 extends from the display area DP to the non-display area. In this way, the permeation of oxygen/moisture through the side portion of the organic film 141, which is relatively weak, is prevented. Thus, at least the organic film 141 forming the interface film directly contacting the organic EL elements 120 has a smaller peripheral area than the inorganic film 145 directly contacting the dummy bank portion 135.

Figure 5:
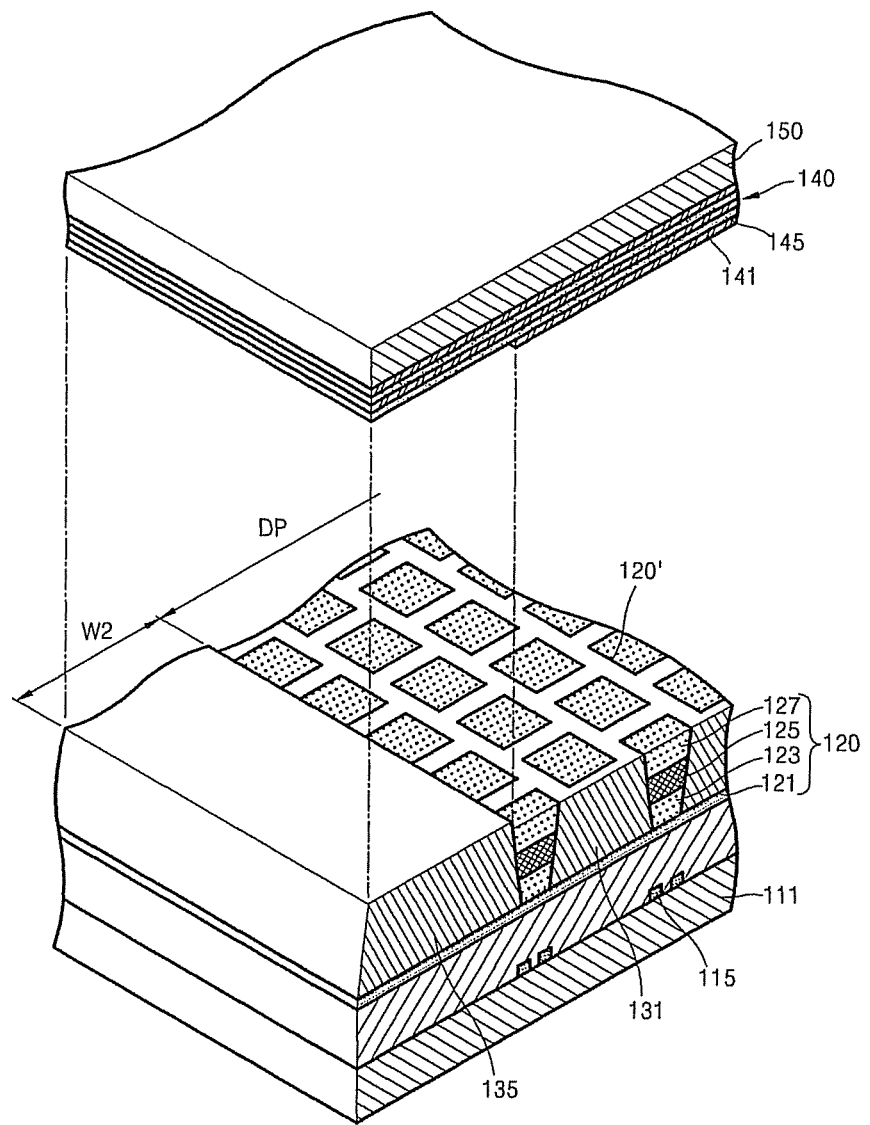
FIG. 5 is a perspective view of an exemplary flat panel display device according to another exemplary embodiment of the present invention.
Figure 6:
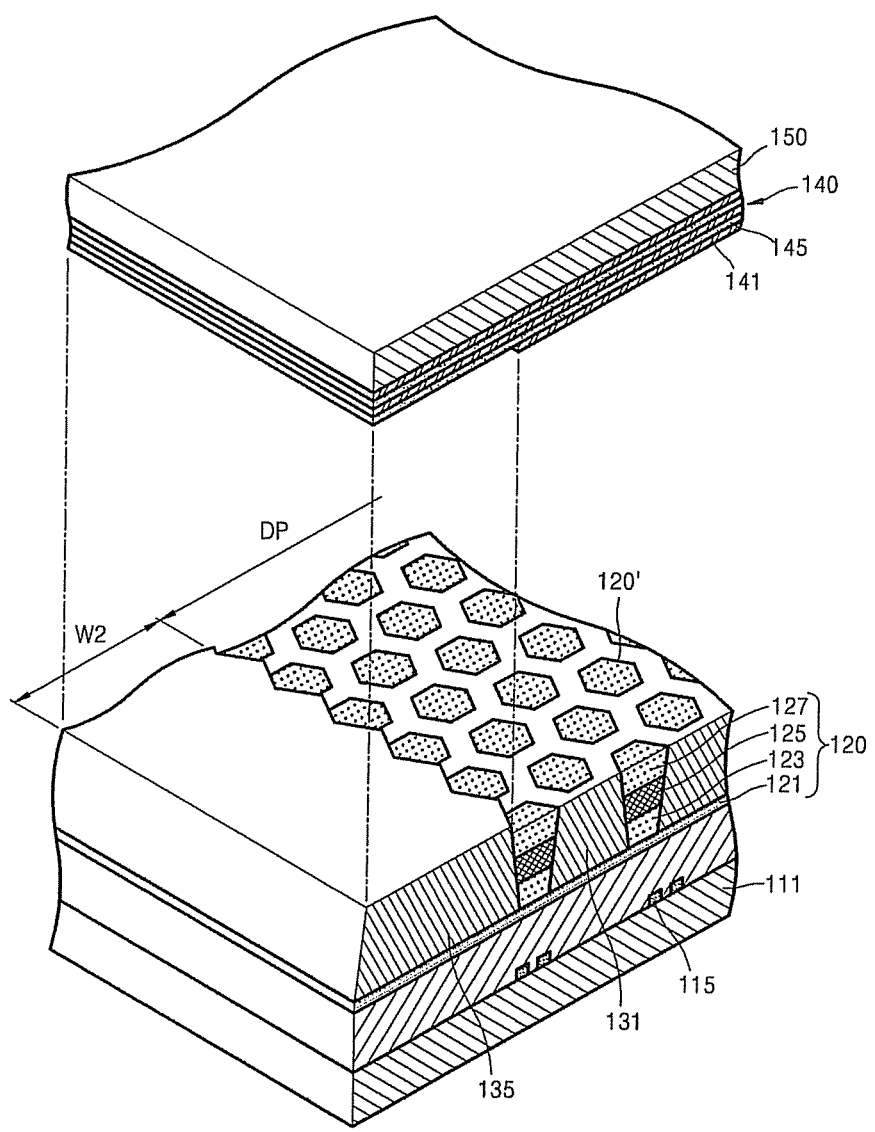
FIG. 6 is a perspective view of an exemplary flat panel display device according to another exemplary embodiment of the present invention.

Referring to FIG. 3, the bank portions 131 are formed in a matrix pattern and the organic EL elements 120 partitioned by the bank portions 131 are arranged in parallel along a first direction and a second direction perpendicular to the first direction. The scope of the invention, however, is not limited to the pattern of the bank portions 131 shown in FIG. 3. FIGS. 5 and 6 are perspective views of exemplary flat panel display devices according to other exemplary embodiments of the present invention. As shown in FIG. 5, the organic EL elements 120 partitioned by the bank portions 131 are arranged in parallel along a first direction but may be also arranged in a zigzag formation along a second direction perpendicular to the first direction. Referring to FIG. 6, organic EL elements 120 partitioned by bank portions 131 have various polygonal shapes in a honey comb structure. In the flat panel display devices shown in FIGS. 5 and 6, like reference numerals denote like elements in the previous embodiment and thus detailed descriptions thereof are omitted.

Figure 7:
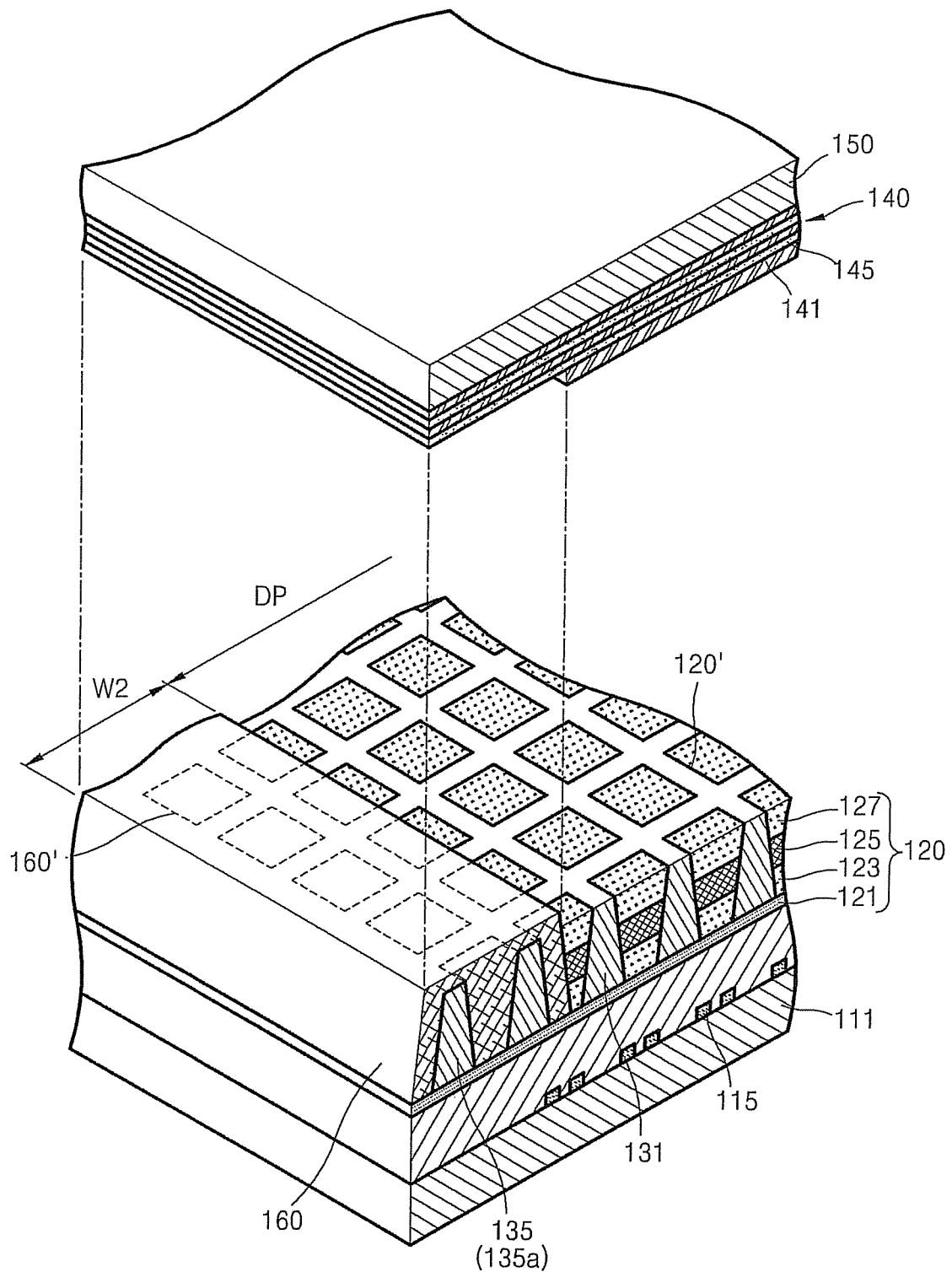
FIG. 7 is a perspective view of an exemplary flat panel display device according to another exemplary embodiment of the present invention.
Figure 8:
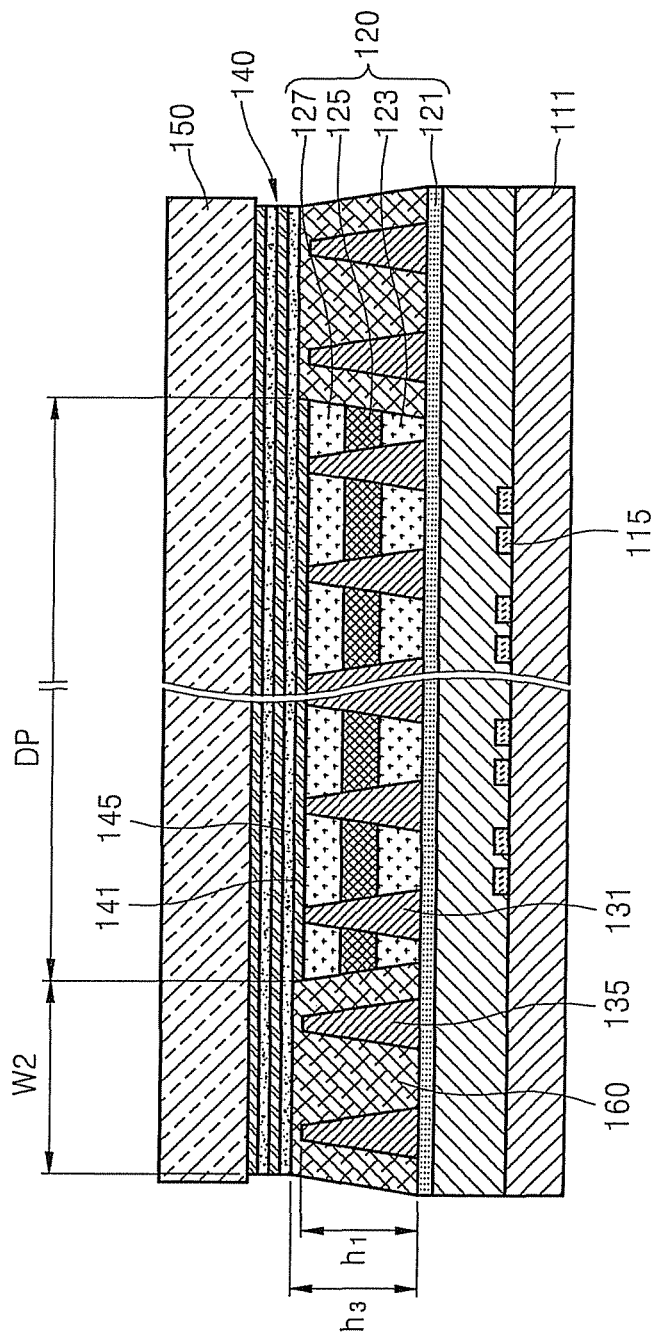
FIG. 8 is a cross-sectional view of the exemplary flat panel display device of FIG. 7, according to an exemplary embodiment of the present invention.

FIG. 7 is a perspective view of an exemplary flat panel display device according to another exemplary embodiment of the present invention and FIG. 8 is a cross-sectional view of the exemplary flat panel display device of FIG. 7 according to an exemplary embodiment of the present invention. Like reference numerals in FIGS. 7 and 8 denote like elements in the previous embodiments. Referring to FIGS. 7 and 8, a plurality of bank portions 131 are provided in a desired pattern, i.e., a matrix pattern in the display area DP and films 123, 125, and 127 forming organic EL elements 120 are deposited successively in a plurality of first openings 120' partitioned by the bank portions 131. The organic EL elements 120 form optical and electrical independent emission areas by the bank portions 131.

In an exemplary embodiment of the present invention, dummy bank portions 135 are provided by extending the same pattern as the bank portions 131, for example, the matrix pattern over the outside of the display area DP and a plurality of second openings 160' are segmented by the dummy bank portions 135. While the first openings 120' in the display area DP are provided for the organic EL elements 120 and define the emission area, the second openings 160' are provided for an encapsulation material layer 160 to prevent the permeation of harmful material as described below. The bank portions 131 and the dummy bank portions 135 integrated therewith may be formed using the following process. After a raw material paste is coated on a substrate 111 supporting the TFT layer 115 and the first electrode 121 thereon, a certain shaped opening pattern is formed in the display area DP and the non-display area by photolithography.

The dummy bank portions 135 with the encapsulation material layer 160 block the permeation of oxygen/moisture in order that the organic EL elements 120 are not oxidized or corroded. Thus, it is desirable that at least two dummy bank portions 135 overlap side by side to sufficiently prevent the permeation of harmful material. The encapsulation material layer 160 fills in the dummy bank portions 135 formed at the non-display area and the second openings 160' between the dummy bank portions 135. It is preferred that the encapsulation material layer 160 be formed of an inorganic material or metal having relatively strong resistance to oxygen/moisture.

The total height h3 of the encapsulation material layer 160 filling the openings 160' between the dummy bank portions 135 preferably exceeds the height h1 of the bank portions 131 in the display area DP, i.e., a relationship of h3>h1 is satisfied. In this way, when a second substrate 150 is located on the dummy bank portions 135, there is no gap between the second substrate 150 and the encapsulation material 160 so a good seal to moisture and oxygen is provided.

In the meantime, a sealing passivation layer 140 is located on the organic EL elements 120 to prevent the permeation of moisture and oxygen. The sealing passivation layer 140 includes an organic film 141 and an inorganic film 145 deposited alternately and preferably includes at least two of the films 141 and 145 for preventing the permeation of moisture and oxygen. The sealing passivation layer 140 extends from the display area DP where the organic EL elements 120 are located, to the non-display area. Thus, it is desirable that at least the interface film directly contacting to the organic EL element 120 is the organic film 141 having a planarizing effect and the film located firstly on the outermost portion of the dummy bank portions 135 covered by the encapsulation material layer 160 is the inorganic film 145 when the multiple layered sealing passivation layer 140 extends from the display area DP to the non-display area. Thus, at least the organic film 141 forming the interface film directly contacting the organic EL elements 120 has a smaller peripheral area than the inorganic film 145 directly contacting the encapsulation material layer 160 over the dummy bank portions 135.

Figure 9:
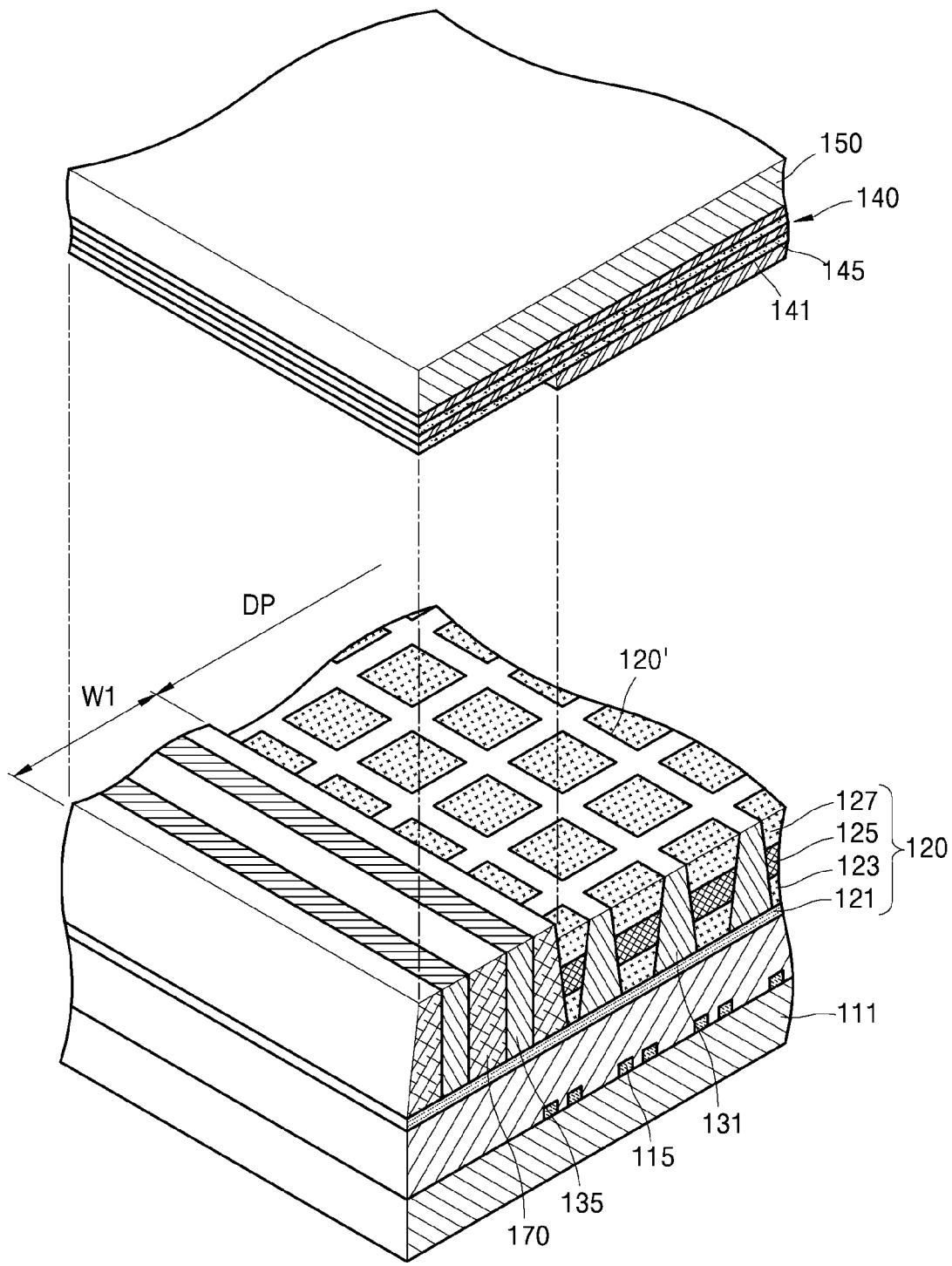
FIG. 9 is a perspective view of an exemplary flat panel display device according to an another exemplary embodiment of the present invention.
Figure 10:
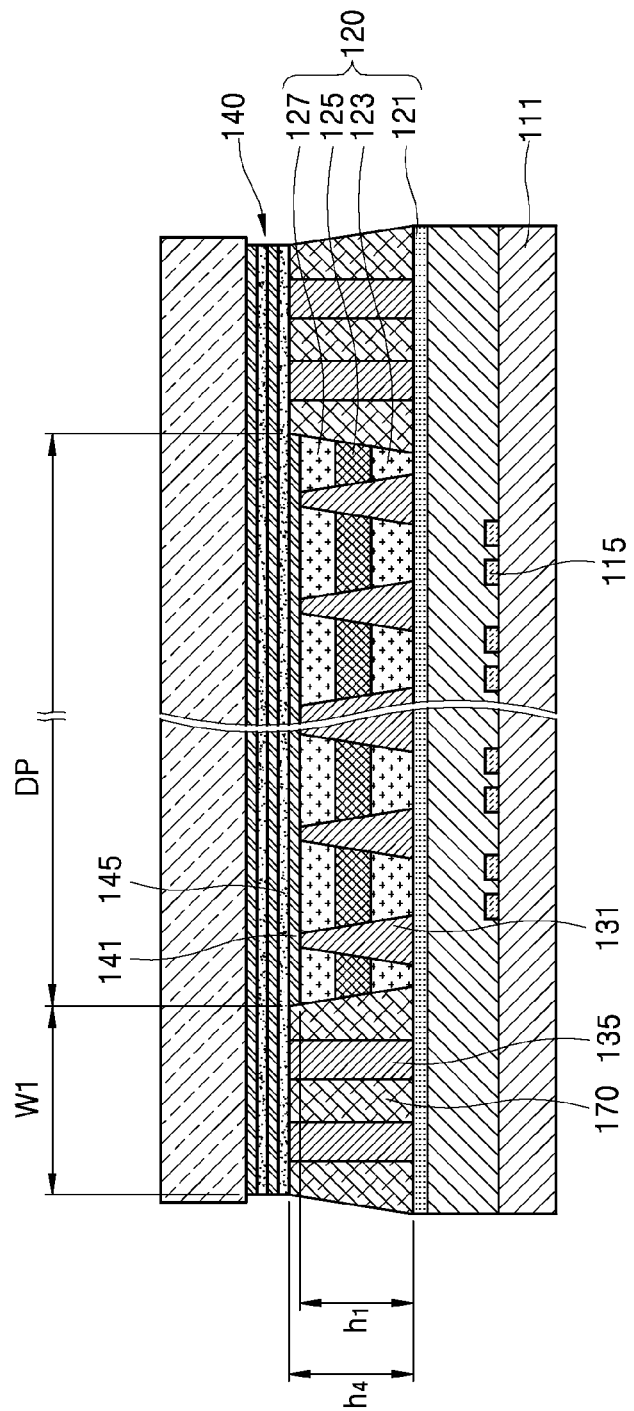
FIG. 10 is a cross-sectional view of the exemplary flat panel display device of FIG. 9, according to an exemplary embodiment of the present invention.

FIGS. 9 and 10 are respective perspective and cross sectional views of a flat panel display device according to another exemplary embodiment of the invention. Like reference numerals in FIGS. 9 and 10 denote like elements in the previous embodiments. Referring to the figures, the bank portions 131 are formed in matrix pattern within the central display area DP and within each opening 120' partitioned by the bank portions 131, the emission layer 123, the hole injection layer 125, and the second electrode 127 are deposited successively to form each organic EL element 120. At the non-display area, and within a width W2, the dummy bank portions 135 are formed. In the exemplary embodiment, blocking members 170 are formed in the dummy bank portions 135. The blocking members 170 may alternate with the dummy bank portions 135. The blocking members 170 may be made of metal or inorganic material having a good blocking property to the outside air such as moisture/oxygen. For example, the dummy bank portions 135 into which the blocking members 170 are inserted may be made by the following manufacturing method. After the blocking members 170 are fixed temporarily on the non-display area on the substrate 111 upon which the TFT layer 115 and the first electrode 121 are deposited, a raw material paste is coated on the overall surface of the first substrate 111. At this time, the blocking members 170 located on the first substrate 111 are enclosed by the paste ejected by a coating device and the blocking members 170 are fixed securely at their positions.

The height h4 of the outer dummy bank portions 135 is preferably higher than the height h1 of the inner bank portion 131, i.e., a relationship of h4) h1 is satisfied so that the organic EL element 120 is sealed by the second substrate 150 covering it. On the organic EL element 120, the sealing passivation layer 140 is provided to prevent the permeation of harmful material. The sealing passivation layer 140 has a multi-layered structure including the organic film 141 and the inorganic film 145 having a different material property to each other and deposited alternately. The sealing passivation layer 140 preferably has at least two or more films 141 and 145. The sealing passivation layer 140 extends from the display area DP to the outside non-display area. It is preferred that at least the interface film directly contacting the organic EL elements 120 is the organic film 141 and the film located firstly on the outermost portion of the dummy bank portions 135 and the blocking members 170 is the inorganic film 145 when the multiple layered sealing passivation layer 140 extends from the display area DP to the non-display area. Thus, at least the organic film 141 forming the interface film directly contacting the organic EL elements 120 has a smaller peripheral area than the inorganic film 145 directly contacting the dummy bank portions 135 and the blocking members 170.

Thus, in each of the above-described exemplary embodiments, a blocking wall is provided on a non-display area of a display device for protecting the inner emission element of the display device from permeation of harmful material such as oxygen/moisture, where the blocking wall includes dummy bank portions formed from the same material used in forming bank portions in the display area of the display device, and formed within a same processing step as the bank portions in the display area of the display device. In exemplary embodiments of the present invention, the blocking wall may include only the dummy bank portions having an enlarged width, may include a same pattern as the bank portions in the display area and then filled with an encapsulation material layer, or many include blocking members alternately arranged with the dummy bank portions. However, it should be understood that the blocking wall may include alternate arrangements while still employing the dummy bank portions within the blocking wall.

For convenience of explanation, the active matrix flat panel display device controlling an input signal per pixel using TFTs has been described as an embodiment of the display device, but the substantial characteristic of the invention is not limited to the driving method. Thus, exemplary features of the present invention may be applied to the passive matrix flat panel display device using the same method as described above.

According to the exemplary flat panel display devices of the exemplary embodiments of the invention, in order to protect the inner emission element of the display device from permeation of harmful material such as oxygen/moisture, the inner portion of the display device is sealed in high sealing property so that degradation of performance such as production of dark spots creating a loss of display function and degradation of luminescence is prevented and the life of the product is prolonged.

Also, according to the exemplary embodiments and features of the invention, the sealing passivation layer is formed in a multiple layered structure and the order of depositing for sealing the passivation layer is limited as described above so that a more effective seal against harmful material is realized.

Further, according to the exemplary flat panel display devices of the exemplary embodiments of the invention, by using the conventional process forming the bank portions, the dummy banks are formed with a shielding function so that additional manufacturing processes or additional charge of manufacturing costs for blocking the permeation of harmful material may be minimized.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A flat panel display device including a display area where a desired image is displayed and a non-display area located at an outside of the display area, the flat panel display device comprising:
   bank portions arranged in a pattern in the display area and partitioning a plurality of openings;
   emission elements located in the openings;
   dummy bank portions formed in the non-display area and integrated with the bank portions in the display area;
   an encapsulation material layer burying the dummy bank portions; and
   a sealing passivation layer covering the emission elements and having a multi-layered structure of at least one organic film and at least one inorganic film alternately arranged,
   wherein encapsulation material in the non-display area contacts the sealing passivation layer.

2. The flat panel display device of claim 1, wherein one of the at least one organic film is located at an interface directly contacting the emission elements and one of the at least one inorganic film is arranged firstly on the dummy bank portions when the sealing passivation layer extends from the display area to the non-display area.

3. The flat panel display device of claim 1, wherein the encapsulation material layer is made of inorganic material.

4. The flat panel display device of claim 1, wherein the encapsulation material layer has a height greater than a height of the bank portions in the display area and a height of the dummy bank portions.

5. A flat panel display device including a display area where a desired image is displayed and a non-display area located at an outside of the display area, the flat panel display device comprising
   bank portions arranged in a pattern in the display area and partitioning a plurality of openings;
   emission elements located in the openings;
   dummy bank portions formed in the non-display area and integrated with the bank portions in the display area;
   an encapsulation material layer burying the dummy bank portions; and
   a sealing passivation layer covering the emission elements and having a multi-layered structure of at least one organic film and at least one inorganic film alternately arranged,
   wherein the dummy bank portions extend in a same pattern as that of the bank portions in the display area and a plurality of openings are partitioned by the dummy bank portions.

6. The flat panel display device of claim 5, wherein the dummy bank portions have at least two or more dummy banks arranged in series with the openings partitioned by the dummy bank portions there between.

7. A flat panel display device including a display area where a desired image is displayed and a non-display area located at an outside of the display area, the flat panel display device comprising:
- bank portions arranged in a pattern in the display area and partitioning a plurality of openings;
- emission elements located in the openings;
- dummy bank portions formed in the non-display area and integrated with the bank portions in the display area;
- blocking members disposed between the dummy bank portions preventing permeation of harmful material to the emission elements; and
- a sealing passivation layer covering the emission elements and having a multi-layered structure of at least one organic film and at least one inorganic film alternately arranged, wherein the dummy bank portions in the non-display area contacts the sealing passivation layer.

8. The flat panel display device of claim 7, wherein faces of the blocking members contact sides of the dummy bank portions.

9. The flat panel display device of claim 7, wherein a height of the dummy bank portions in the non-display area is greater than a height of the bank portions in the display area.

10. The flat panel display device of claim 7, wherein one of the at least one organic film having a planarizing effect is arranged at an interface of the sealing passivation layer directly contacting the emission elements and one of the at least one inorganic film is arranged firstly on the dummy bank portions where the sealing passivation layer extends from the display area to the non-display area.

11. The flat panel display device of claim 7, wherein the blocking members are made of inorganic material.

* * * * *